(12) United States Patent
Tsai et al.

(10) Patent No.: US 11,145,356 B2
(45) Date of Patent: Oct. 12, 2021

(54) COMPUTATION OPERATOR IN MEMORY AND OPERATION METHOD THEREOF

(71) Applicant: Industrial Technology Research Institute, Hsinchu (TW)

(72) Inventors: Fu-Cheng Tsai, Tainan (TW); Heng-Yuan Lee, Hsinchu County (TW); Chih-Sheng Lin, Tainan (TW); Jian-Wei Su, Hsinchu (TW); Tuo-Hung Hou, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/850,016

(22) Filed: Apr. 16, 2020

(65) Prior Publication Data

US 2021/0257017 A1    Aug. 19, 2021

(30) Foreign Application Priority Data

Feb. 17, 2020    (TW) ................................ 109104936

(51) Int. Cl.
| | | |
|---|---|---|
| *G11C 11/34* | (2006.01) | |
| *G11C 11/408* | (2006.01) | |
| *G11C 11/56* | (2006.01) | |
| *G11C 11/4099* | (2006.01) | |
| *G11C 11/4091* | (2006.01) | |

(52) U.S. Cl.
CPC ...... *G11C 11/4085* (2013.01); *G11C 11/4091* (2013.01); *G11C 11/4099* (2013.01); *G11C 11/5642* (2013.01)

(58) Field of Classification Search
CPC ............ G11C 11/4085; G11C 11/4099; G11C 11/4091; G11C 11/5642
See application file for complete search history.

(56) References Cited

U.S. PATENT DOCUMENTS

| 5,063,521 A | 11/1991 | Peterson et al. |
|---|---|---|
| 7,313,649 B2 | 12/2007 | Tomita et al. |
| (Continued) | | |

FOREIGN PATENT DOCUMENTS

| CN | 109656722 | 4/2019 |
|---|---|---|
| CN | 109871995 | 6/2019 |
| (Continued) | | |

OTHER PUBLICATIONS

"Office Action of Taiwan Counterpart Application", dated Aug. 25, 2020, p. 1-p. 3.

(Continued)

*Primary Examiner* — Uyen Smet
(74) *Attorney, Agent, or Firm* — JCIPRNET

(57) ABSTRACT

A computation operator in memory and an operation method thereof are provided. The computation operator in memory includes a word line calculator, a decision-maker and a sense amplifier. The word line calculator calculates a number of enabled word lines of a memory. The decision-maker generates a plurality of reference signals according to at least one of the number of enabled word lines and a used size of the memory, the reference signals are configured to set a distribution range. The sense amplifier receives a readout signal of the memory, and obtains a computation result by converting the readout signal according to the reference signals.

13 Claims, 3 Drawing Sheets

(56) References Cited

U.S. PATENT DOCUMENTS

| | | |
|---|---|---|
| 7,609,582 B2 | 10/2009 | Park |
| 8,670,279 B2 | 3/2014 | Yoon |
| 10,340,003 B1* | 7/2019 | Chang ................ G11C 13/0026 |
| 2006/0092712 A1 | 5/2006 | Park |
| 2007/0133330 A1* | 6/2007 | Ohsawa ............ H01L 27/10802 365/222 |
| 2015/0131383 A1 | 5/2015 | Akerib et al. |
| 2016/0328646 A1 | 11/2016 | Lin et al. |
| 2017/0286830 A1 | 10/2017 | El-Yaniv et al. |
| 2019/0042160 A1 | 2/2019 | Kumar et al. |
| 2019/0065093 A1 | 2/2019 | Karr et al. |
| 2019/0080231 A1 | 3/2019 | Nestler et al. |
| 2019/0172542 A1 | 6/2019 | Miladinovic |
| 2019/0187898 A1 | 6/2019 | Gu et al. |

FOREIGN PATENT DOCUMENTS

| | | |
|---|---|---|
| TW | 201316341 | 4/2013 |
| TW | I616825 | 3/2018 |
| WO | 2009004040 | 1/2009 |

OTHER PUBLICATIONS

Hubara, I. et al., "Binarized neural networks," Neural Information Processing Systems 29, 2016, pp. 1-9.

Rastegari, M. et al., "Xnor-net: Imagenet classification using binary convolutional neural networks," arXiv preprint arXiv:1603.05279v4, Aug. 2, 2016, pp. 1-17.

Kim, H. et al., "In-memory batch-normalization for resistive memory based binary neural network hardware," Proceedings of the 24th Asia and South Pacific Design Automation Conference, Jan. 2019, pp. 645-650.

Shafiee, A. et al., "ISAAC: A convolutional neural network accelerator with in-situ analog arithmetic in crossbars," ACM SIGARCH Computer Architecture News, Jun. 2016, pp. 1-13.

Jiang, Z. et al., "XNOR-SRAM: In-Memory Computing SRAM Macro for Binary/Ternary Deep Neural Networks," 2018 IEEE Symposium on VLSI Technology, Jun. 18-22, 2018, pp. 1-2.

* cited by examiner

COMPUTATION OPERATOR IN MEMORY AND OPERATION METHOD THEREOF

CROSS-REFERENCE TO RELATED APPLICATION

This application claims the priority benefit of Taiwan application no. 109104936, filed on Feb. 17, 2020. The entirety of the above-mentioned patent application is hereby incorporated by reference herein and made a part of this specification.

TECHNICAL FIELD

The disclosure relates to a computation operator in memory and an operation method thereof, and relates to a computation operator in memory and an operation method thereof that can adjust a digital conversion range of a sense amplifier.

BACKGROUND

With the maturity of artificial intelligence technology, electronic devices with artificial intelligence computing capabilities have flourished. In order to improve a neural network for performing artificial Intelligence computing, a concept of computing in memory (CIM) is proposed.

Computation in memory is to use memory cells as nodes in the neural network, write data into the memory cells, change equivalent resistances or transduction values of the memory cells as weights, and then provide input signals to the memory cells so that the memory cells can perform multiplication and addition (or convolution operation) on the input signals to generate a computation result. The operation in memory may be used to greatly reduce a circuit area and improve an execution efficiency of the neural network.

It is worth noting that the computation operator in memory of the conventional technology is often provided with a sense amplifier having a fixed reference signal to perform a conversion on a readout signal generated by a memory cell array. However, a size range of current values of the readout signal may change with the scale of the input signal and the number of nodes in the neural network. Therefore, when the sense amplifier having the fixed reference signal is used to execute the conversion of the readout signal, a conversion time may be wasted or an excessive power loss may be caused.

SUMMARY

The disclosure provides a computation operator in memory and an operation method thereof that can reduce power consumption and increase computation speed.

The computation operator in memory of the disclosure includes a word line calculator, a decision-maker and a sense amplifier. The word line calculator calculates a number of enabled word lines of a memory. The decision-maker is coupled to an operation controller, and generates a plurality of reference signals according to at least one of the number of enabled word lines and a used size of the memory, wherein the reference signals are configured to set a distribution range. The sense amplifier is coupled to the memory and the decision-maker, receives a readout signal of the memory, and obtains a computation result by converting the readout signal according to the reference signals.

An operation method in memory of the disclosure includes: calculating a number of enabled word lines of a memory; generating a plurality of reference signals according to at least one of the number of enabled word lines and a used size of the memory, wherein the reference signals are configured to set a distribution range; and receiving a readout signal of the memory, and obtaining a computation result by converting the readout signal according to the reference signals.

Based on the above, the disclosure provides the decision-maker, which generates the reference signals according to at least one of the used size and the number of enabled word lines of the memory, and then sets the digital conversion range of the sense amplifier according to the reference signals so as to increase computation speed and reduce power consumption.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
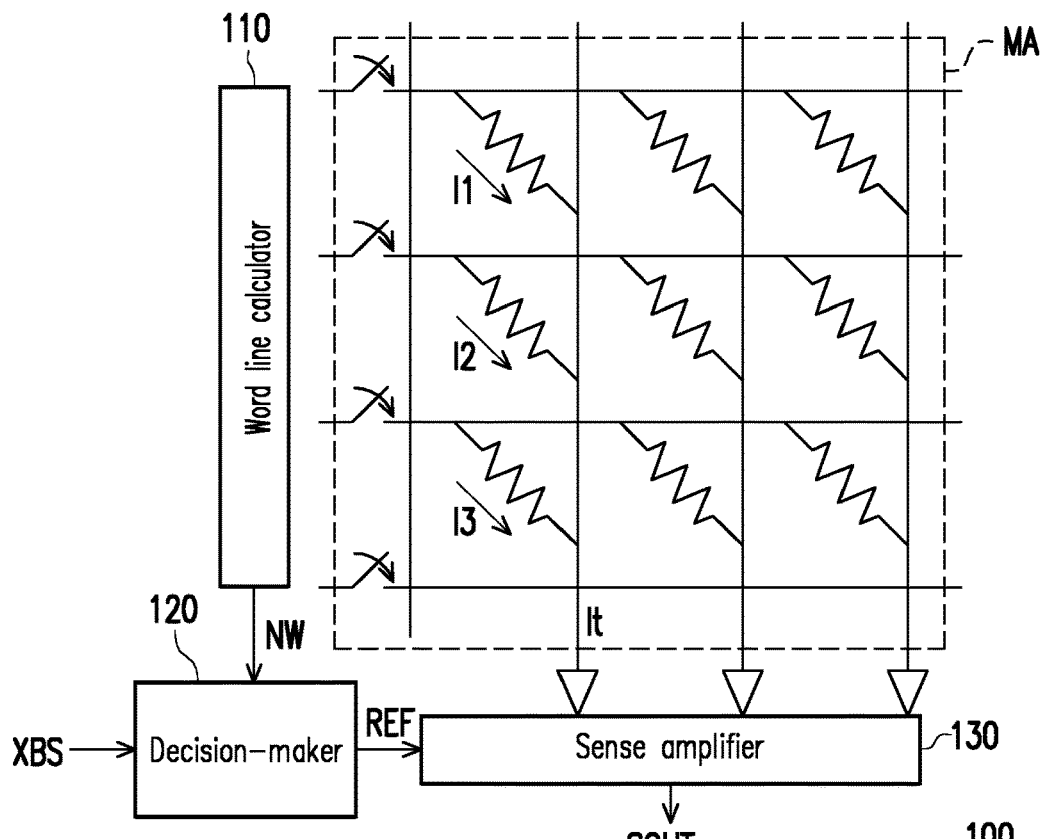
FIG. 1 illustrates a schematic diagram of a computation operator in memory in an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, FIG. 1 illustrates a schematic diagram of a computation operator in memory in an embodiment of the disclosure. A computation operator in memory 100 includes a word line calculator 110, a decision-maker 120 and a sense amplifier 130. The word line calculator 110 is coupled to a memory cell array MA, and configured to calculate a number of enabled word lines NW of the memory cell array MA. The decision-maker 120 is coupled to the word line calculator 110. The decision-maker 120 receives the number of enabled word lines NW of the memory cell array MA and a used size XBS of the memory cell array MA, and generates a plurality of reference signals REF according to at least one of the used size XBS and the number of enabled word lines NW of the memory cell array MA.

On the other hand, the sense amplifier 130 is coupled to the memory cell array MA and the decision-maker 120. The sense amplifier 130 receives the reference signal REF, wherein the reference signal REF may be used to set a distribution range of a digital conversion performed by the sense amplifier 130. The sense amplifier 130 receives a readout signal It from the memory cell array MA, and obtains a computation result SOUT by converting the readout signal It according to the reference signals REF. In details, the sense amplifier 130 compares the readout signal It with the reference signals REF to obtain the computation result S OUT.

In this embodiment, a plurality of memory cells in the memory cell array MA are used to store a plurality of weights (e.g., expressed by transduction values of the memory cells). After an input signal is received, the memory cell generates signals I1 to I3 (current signals) according to the input signal and the stored by the memory cell through the enabled word line. The readout signal It may be a sum of the signals I1 to I3. The computation operator in memory 100 may be used to realize a neural network operation.

In terms of practical implementation, the memory cell array MA may be a non-volatile memory, such as a flash memory, a resistive memory, or any non-volatile memory that can be read and written multiple times.

Incidentally, the used size XBS of the memory cell array MA may be set according to an analysis object corresponding to the neural network operation. The memory cell array MA may have a relatively large size to respond to different analysis objects, and to respond to neural networks with different numbers of nodes. The used size XBS of the memory cell array MA may be set to a value not larger than a total size of the memory cell array MA.

In this embodiment, the sense amplifier 130 may be an analog-to-digital conversion circuit. The sense amplifier 130 sets a digital distribution range of digital codes generated in an analog-to-digital conversion performed according to the reference signals REF. Specifically, when the used size XBS and/or the number of enabled word lines NW of the memory cell array MA is relatively small, the readout signal that the sense amplifier 130 may receive also has a relatively small value. Therefore, by reducing the distribution range formed by the reference signals REF, the efficiency of the analog-to-digital conversion performed by the sense amplifier 130 may be improved. In contrast, when the used size XBS and/or the number of enabled word lines NW of the memory cell array MA is relatively large, the readout signal that the sense amplifier 130 may receive also has a relatively large value. Therefore, by properly increasing the distribution range formed by the reference signals REF, the accuracy of the analog-to-digital conversion performed by the sense amplifier 130 may be maintained, and work efficiency may be improved.

In this way, according to at least one the used size XBS and the number of enabled word lines NW of the memory cell array MA, the sense amplifier 130 may adaptively adjust the distribution range of the computation result SOUT to be generated so as to increase conversion speed and reduce power loss.

Further, in this embodiment, the decision-maker 120 may be implemented by applying a digital circuit. The decision-maker 120 may be a hardware circuit designed through Hardware Description Language (HDL) or any other design methods for digital circuit well-known to persons with ordinary skill in the art and may be implemented in from of Field Programmable Gate Array (FPGA), Complex Programmable Logic Device (CPLD) or Application-specific Integrated Circuit (ASIC). Alternatively, the decision-maker 120 may also be any type of processor with computing capabilities, and there is no particular limitations.

In the embodiments of the disclosure, the word line calculator 110 may also be implemented by a digital circuit, which is used to calculate the number of word lines of the memory cell array MA enabled at the same time in each operation.

Figure 2:
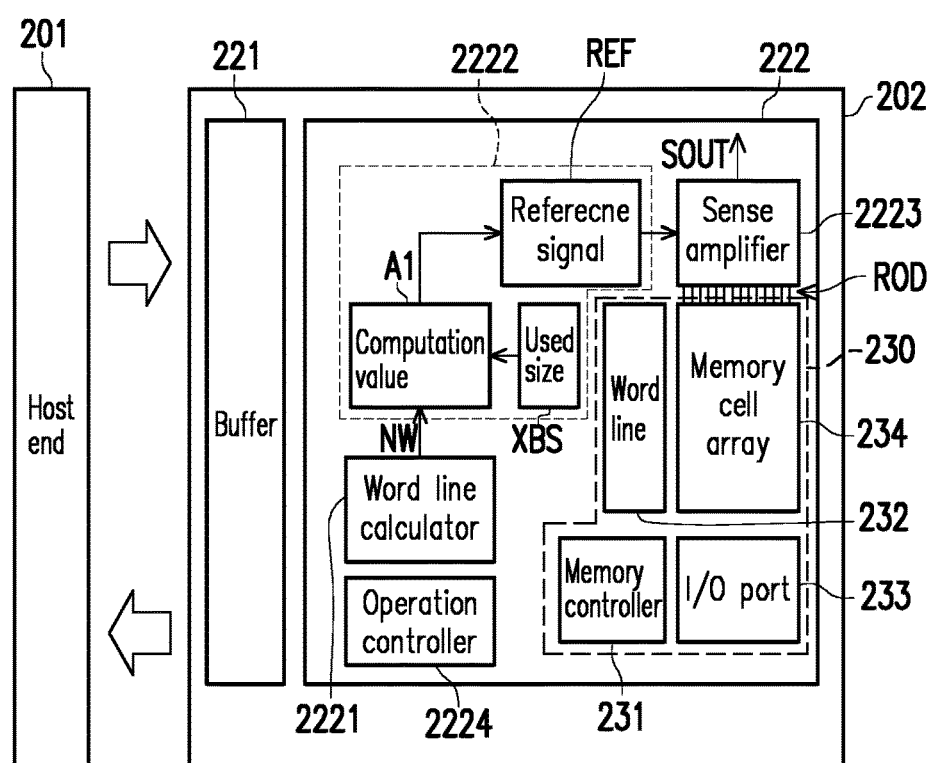
FIG. 2 illustrates a schematic diagram of a computation operator in memory in another embodiment of the disclosure.

Referring to FIG. 2, FIG. 2 illustrates a schematic diagram of a computation operator in memory in another embodiment of the disclosure. A computation operator in memory 202 is coupled to a host end 201 to form a system 200. The computation operator in memory 202 may perform a neural network operation according to commands of the host end 201. The computation operator in memory 202 includes a memory 230 and a buffer 221. The computation operator in memory 202 includes a word line calculator 2221, a decision-maker 2222, a sense amplifier 2223 and an operation controller 2224. The memory 230 includes a memory controller 231, a word line 232, an input/output (I/O) port 233 and a memory cell array 234.

In this embodiment, the operation controller 2224 is configured to control behavior in each neural network operation. The word line calculator 2221 is configured to count the number of enabled word lines NW of the word line 232 in each operation. Based on the above, the word line calculator 2221 may know the number of enabled word lines NW of the word line 232 through the operation controller 2224. The decision-maker 2222 is coupled to the word line calculator 2221 to receive the number of enabled word lines NW of the word line 232. In addition, the decision-maker 2222 receives the used size XBS of the memory 230, and generates a computation value AI according to at least one of the number of enabled word lines NW and the used size XBS. The decision-maker 2222 then generates the reference signals REF according to the computation value AI.

The decision-maker 2222 provides the reference signals REF to the sense amplifier 2223. The sense amplifier 2223 may set the distribution range according to the reference signals REF, convert a readout signal ROD provided by the memory cell array 234 according to the reference signals REF, and thereby obtain the computation result SOUT.

In this embodiment, the buffer 221 may be provided to the computation operator in memory 202 as a medium for temporarily storing data. The buffer 221 may be constructed using any type of random access memory (RAM), and there is no particular limitations.

Further, in this embodiment, the used size XBS of the memory 230 may be set by the host end 201 and input to the decision-maker 2222 by a write command. A register or a memory in the decision-maker 2222 may be provided to store the used size XBS. The buffer 221 also serves as a medium for recording the used size XBS without particular limitations.

On the other hand, the memory controller 231 is used to perform read and write operations of the memory cell array 234, and the input/output port 233 is used as a data access medium of the memory cell array 234.

Figure 3A:
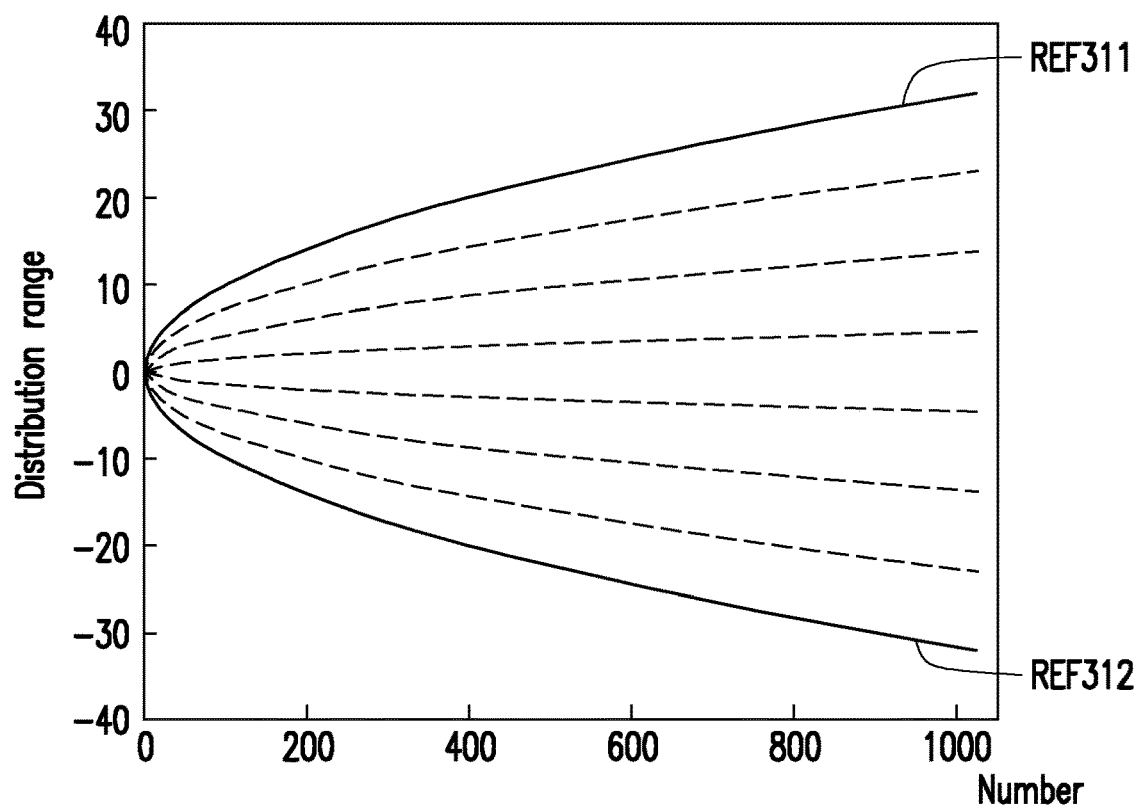
FIG. 3A to FIG. 3C are schematic diagrams respectively illustrating different implementations for generating reference signals in the embodiments of the disclosure.
Figure 3B:
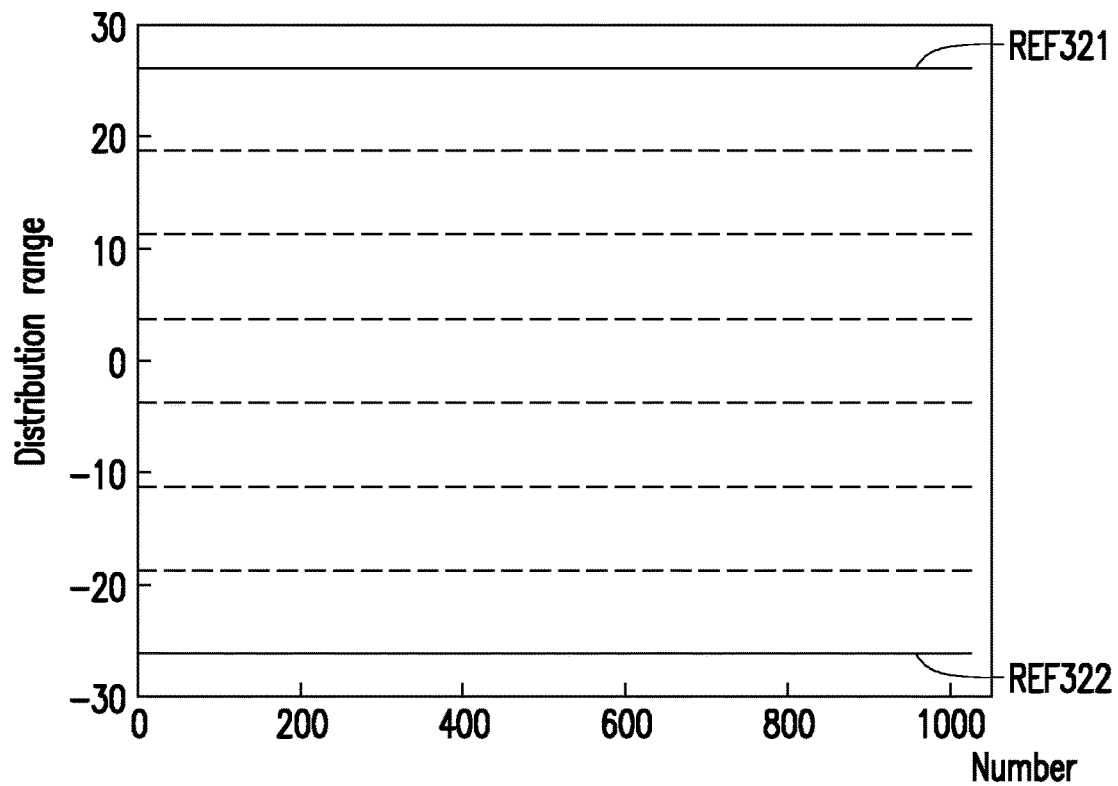
Figure 3C:
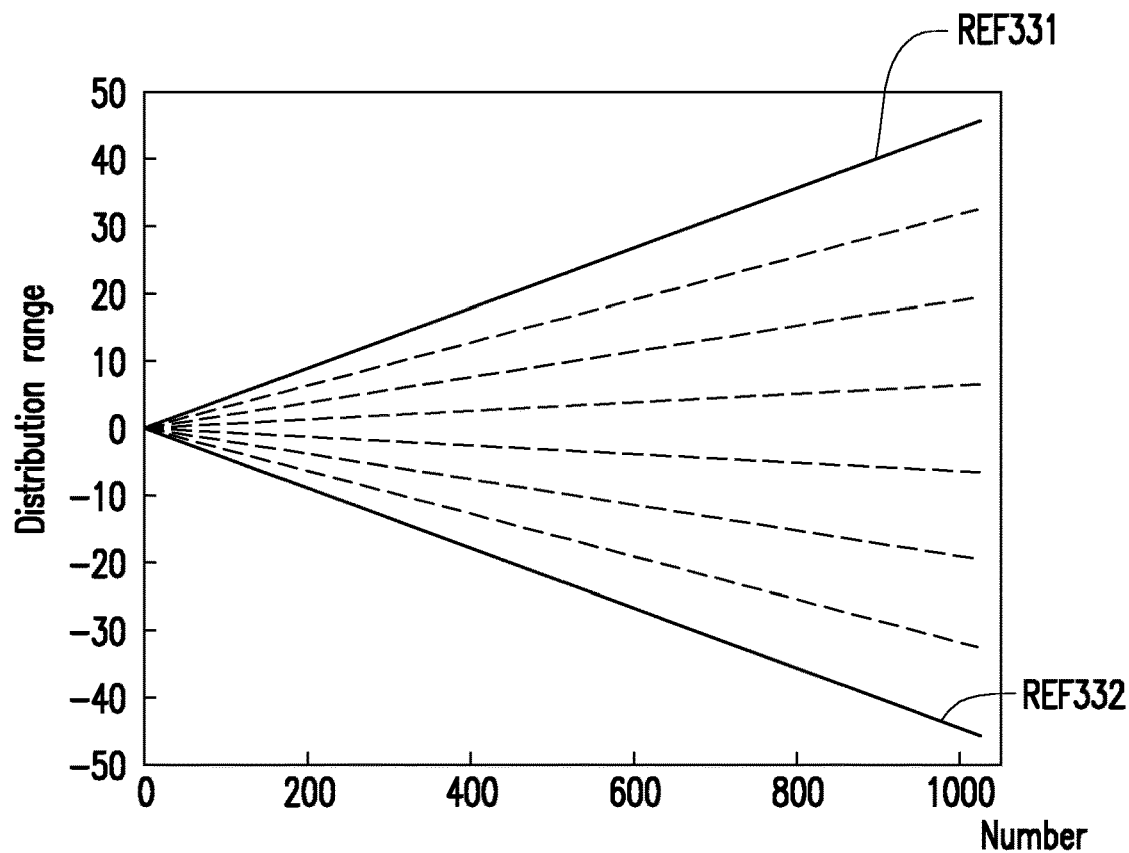

Implementation details regarding the above may refer to FIG. 2 and FIG. 3A to FIG. 3C together. FIG. 3A to FIG. 3C are schematic diagrams respectively illustrating different implementations for generating reference signals in the embodiments of the disclosure. In FIG. 3A to FIG. 3C, the horizontal axis represents the number of enabled word lines NW, and the vertical axis represents the digital distribution range set by the sense amplifier 2223.

Referring to FIG. 3A first, in this embodiment, the decision-maker 2222 may set the reference signals REF311 to REF312 according to a square root of the number of enabled word lines NW of the memory cell array 234. Here, in correspondence to the same number of enabled word lines NW, absolute values of the reference signals REF311 and REF312 are identical. Further, in FIG. 3A, the reference signals REF311 to REF312 show a non-linear change with changes in the number of enabled word lines NW. Also, a size of the distribution range is in a non-linear positive correlation with the number of enabled word lines NW. In other words, the larger the number of enabled word lines NW, the larger the distribution range of the reference signals REF311 to REF312.

With the number of enabled word lines NW being m as an example, the reference signals REF311 to REF312 may be set according to $\alpha\sqrt{m}$. Here, $\alpha$ is a non-zero real number.

Next, referring to FIG. 3B, in FIG. 3B, the decision-maker 2222 sets the reference signals REF311 to REF312 according to a square root of the used size of the memory cell array 234. In this embodiment, the reference signals REF321 to REF322 may be set according to $\beta\sqrt{2k/3}$. Here, $\beta$ is a non-zero constant (real number), and k is the used size XBS of the memory cell array 234. In correspondence to the same number of enabled word lines NW, absolute values of the reference signals REF321 and REF322 are identical. A size of the distribution range set according to the reference signals REF321 to REF322 may be independent from the number of enabled word lines NW.

It should be noted that, the aforementioned k is the used size XBS of the memory cell array 234 obtained by having a maximum number of enabled word lines in the memory 230. After the reference signals REF321 to REF322 are determined, they will not change as the number of enabled word lines NW changes. However, it is worth noting that the neural network often has multiple layers, and the value of the k may be different in a plurality of computation operators in memory disposed respectively corresponding to the multiple layers.

Next, referring to FIG. 3C, in FIG. 3C, the decision-maker 2222 may set the reference signals REF331 to REF332 according to a square root of the number of enabled word lines NW and the used size XBS in the memory cell array 234. Here, the reference signals REF331 to REF332 may be set according to $\gamma\sqrt{k/2}\times m$. Among them, $\gamma$ is a non-zero constant; k is the used size XBS of the memory cell array 234; and m is the number of enabled word lines NW and used to limit the distribution range.

In this embodiment, the reference signals REF331 to REF332 shows a linear change with changes in the number of enabled word lines NW, and a size of the distribution range is in a linear positive correlation with the number of enabled word lines NW.

It is worth mentioning that in FIG. 3A to FIG. 3C, the number of reference signals is not particularly limited. The designer may set the number of reference signals according to the number of bits of the computation result SOUT to be generated by the sense amplifier 2223.

Figure 4:
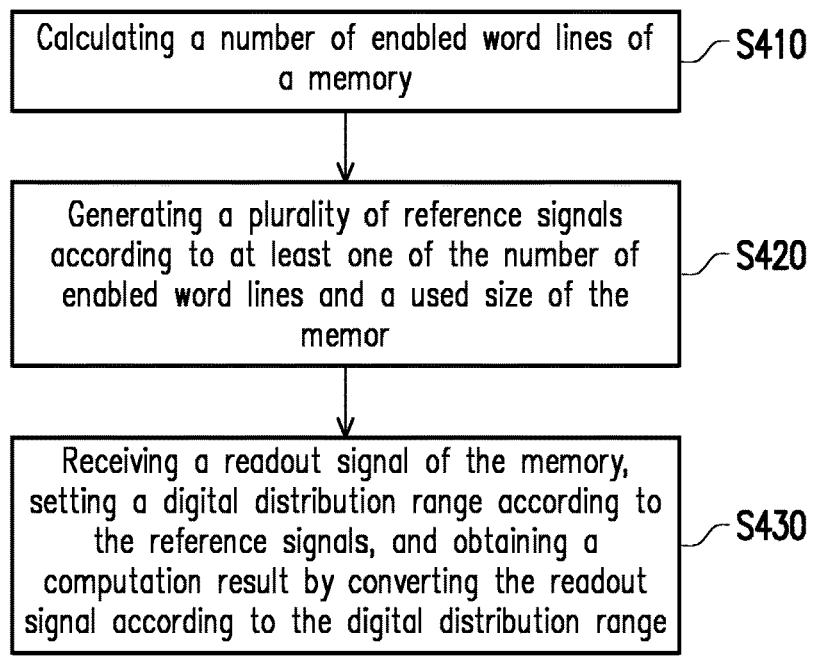
FIG. 4 illustrates a flowchart of an operation method in memory in an embodiment of the disclosure.

Referring to FIG. 4, FIG. 4 illustrates a flowchart of an operation method in memory in an embodiment of the disclosure. In step S410, a number of enabled word lines of a memory is calculated. Next, in step S420, a plurality of reference signals are generated according to at least one of the number of enabled word lines and a used size of the memory, and the reference signals may be configured to set a distribution range. In step S430, a readout signal of the memory is received, a digital distribution range is set according to the reference signals, and a computation result is obtained by converting the readout signal according to the digital distribution range.

Relevant implementation detail for the steps above has been described in the foregoing embodiments and implementations, which is not repeated hereinafter.

In summary, the disclosure may be used to conduct calculations by detecting the number of enabled word lines of the memory together with the used size of the memory in each operation, and accordingly set the readout signals for the sense amplifier to sense the readout signal. By dynamically controlling the distribution range of the reference signals, the sense amplifier may increase digital conversion speed, reduce unnecessary power consumption, and improve overall performance of the computation operator in memory.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. A computation operator in memory, comprising:
    a word line calculator, calculating a number of enabled word lines of a memory;
    a decision-maker, coupled to the word line calculator, and generating a plurality of reference signals according to at least one of the number of enabled word lines and a used size of the memory, wherein the decision-maker sets the reference signals according to a square root of the number of enabled word lines of the memory, or according to a square root of the used size of the memory, or according to a square root of the number of enabled word lines and the used size of the memory, and the reference signals are configured to set a distribution range; and
    a sense amplifier, coupled to the memory and the decision-maker, receiving a readout signal of the memory, and obtaining a computation result according to the reference signals.

2. The computation operator in memory according to claim 1, wherein a size of the distribution range is positively correlated with the number of enabled word lines.

3. The computation operator in memory according to claim 1, wherein a size of the distribution range is independent from the number of enabled word lines.

4. The computation operator in memory according to claim 1, wherein the reference signals are set according to $\beta\sqrt{2k/3}$, wherein $\beta$ is a non-zero constant, and k is the used size of the memory.

5. The computation operator in memory according to claim 1, wherein the reference signals are set according to $\gamma\sqrt{k/2}\times m$, wherein $\gamma$ is a non-zero constant, k is the used size of the memory, and m is the number of enabled word lines.

6. The computation operator in memory according to claim 1, wherein the distribution range is proportional to the number of enabled word lines.

7. The computation operator in memory according to claim 1, further comprising:
    an operation controller, coupled to the memory and configured to perform a computing operation in memory.

8. An operation method in memory, comprising:
    calculating a number of enabled word lines of a memory;
    generating a plurality of reference signals according to at least one of the number of enabled word lines and a used size of the memory, comprising setting the reference signals according to a square root of the number of enabled word lines of the memory, or setting the reference signals according to a square root of the used size of the memory, or setting the reference signals according to a square root of the number of enabled word lines and the used size of the memory, wherein the reference signals are configured to set a distribution range; and receiving a readout signal of the memory, and obtaining a computation result by converting the readout signal according to the reference signals.

9. The operation method in memory according to claim 8, wherein a size of the distribution range is positively correlated with the number of enabled word lines.

10. The operation method in memory according to claim 8, wherein a size of the distribution range is independent from the number of enabled word lines.

11. The operation method in memory according to claim 8, wherein the reference signals are set according to $\beta\sqrt{2k/3}$, wherein $\beta$ is a non-zero constant, and k is the used size of the memory.

12. The operation method in memory according to claim 8, wherein the reference signals are set according to $\gamma\sqrt{k/2}\times m$, wherein $\gamma$ is a non-zero constant, k is the used size of the memory, and m is the number of enabled word lines.

13. The operation method in memory according to claim 8, wherein the distribution range is proportional to the number of enabled word lines.

* * * * *